United States Patent [19]

Beirne et al.

[11] 4,182,936
[45] Jan. 8, 1980

[54] TRANSFORMERLESS TRUNK CIRCUIT

[75] Inventors: Patrick R. Beirne, Stittsville; Michael C. J. Cowpland, Ottawa; Raymond J. Whitbread, Ashton, all of Canada

[73] Assignee: Mitel Corporation, Canada

[21] Appl. No.: 925,297

[22] Filed: Jul. 17, 1978

[30] Foreign Application Priority Data

Feb. 28, 1978 [CA] Canada ................................... 297883

[51] Int. Cl.$^2$ ............................................. H04M 7/10
[52] U.S. Cl. ......................... 179/18 AH; 179/18 FA; 179/16 EC
[58] Field of Search ......... 179/18 FA, 16 EC, 18 AH Primary Examiner—William C. Cooper
Attorney, Agent, or Firm—Craig and Antonelli

[57] ABSTRACT

A transformerless two-way trunk circuit particularly useful for interconnecting a balanced lead pair and an unbalanced lead pair, with complete control over sidetone and signal level. The balanced lead pair is terminated with a first matching A.C. impedance and a second D.C. resistance means. A first transformerless circuit means applies an incoming signal from the unbalanced lead pair to the balanced lead pair, and a second transformerless circuit means applies an incoming signal from the balanced pair to the unbalanced lead pair. A third transformerless circuit means cancels signals from said first circuit means applied to the balanced lead pair to prevent them from being reapplied to the unbalanced lead pair, and a fourth transformerless circuit means cancels signals from said second circuit means applied to the unbalanced lead pair to prevent them from being reapplied to the balanced lead pair.

18 Claims, 3 Drawing Figures

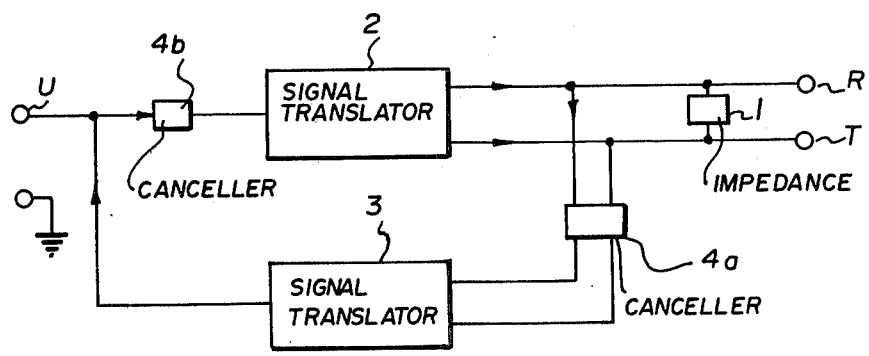
FIG. 1
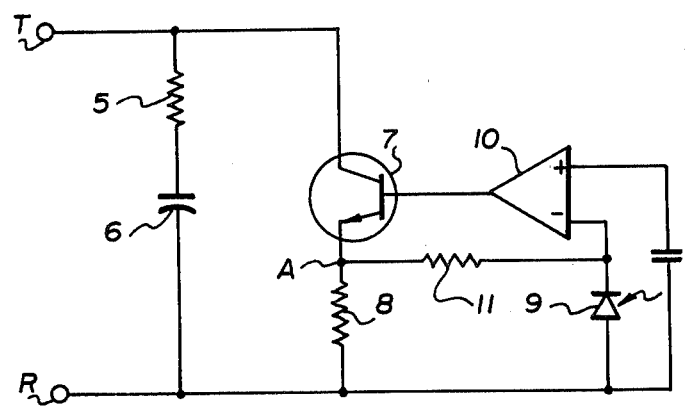
FIG. 2
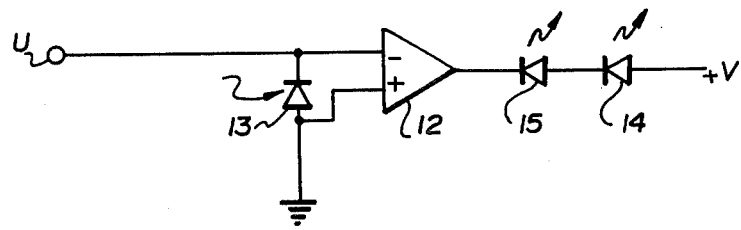

TRANSFORMERLESS TRUNK CIRCUIT

This invention relates to a bidirectional amplifier, and more particularly to a bidirectional trunk circuit for coupling a first pair of leads such as a trunk and a second pair such as a junctor.

Trunk circuits are generally used for handling incoming or outgoing calls to or from a central office or PBX. Due to the existence of a wide variety of kinds of central offices and PBXs, certain operational characteristics of trunks have become standardized. Yet because of the requirement of trunks to interface with various different internal circuits of the central offices or private exchanges which circuitry often does not match the trunk characteristics, trunk circuits are in addition required to effect the various matching conversions.

Trunk impedances have become standardized at typically either 900 or 600 ohms, and are comprised of balanced tip and ring leads. Trunk circuits also carry signalling information and typically carry current of either polarity at 48 volts DC. They normally carry signals at a level of about 0 dbm, although the signal levels often vary widely and sometimes are as high as +6 dbm, which is between 5 and 6 volts peak to peak at the approximate impedance levels noted.

Yet due to the large number of trunks exposed to the weather and due to other environmental factors such as high voltage power lines, poor or changing ground resistance, temperature variations mechanically affecting terminations, etc, sometimes large common mode signals result on the trunks, sometimes as high as ±200 volts AC.

Trunk circuits further must terminate the tip and ring leads with a matching impedance for AC signals, yet must have internal resistance for direct current which has been standardized at under 250 ohms.

The trunks must further be able to carry either signalling alone (tone duplex or battery reversal) or signalling including ringing signals. They must also provide separate control of the gain of both incoming and outgoing voice or other message signals in order that they can be set at the proper working levels for the central office or PBX.

While trunks themselves are normally electrically balanced, their signals are inherently differential in nature, due to the aforenoted common-mode signal problem. Thus a PBX or central office which operates on simple AC audio signals must have means for coupling the audio signals to the trunks in a differential, isolated manner. The unbalanced pair feeding a trunk circuit (i.e one terminal and ground) can be of whatever impedance is most convenient to the switching office or PBX designer, but is often 600 ohms.

The trunk circuit must therefore translate the unbalanced input circuit to a balanced output circuit and vice versa, must match the respective trunk or unbalanced impedances, must adjust the signal levels to the standard signal level required both on the trunk and unbalanced lead pair, must remove very high common mode signals often carried by the trunk, must present a different AC impedance to the trunk than DC impedance, etc.

Trunk circuits have previously used circuits involving hybrid transformers to provide the matching and common mode reduction required. However with the advent of electronic switching offices and PBXs of considerably reduced size and weight, the use of such transformers is an impediment to miniaturization. For example where the circuitry of a PBX is built into a small console, cabinet or desk, within which the circuitry is disposed on printed circuit boards, such transformers add bulk, weight and increasingly unacceptable size to the unit, and as well are to some extent incongruous with printed circuit boards carrying microelectronic components. The bulk of the transformers are of course due to the requirement for a significantly sized core which will not saturate in the presence of high AC and DC trunk currents.

The present invention is a trunk circuit which provides the requirements of a trunk noted above, but which does not require the use of a hybrid transformer. Physically the circuitry is light and small and can be fabricated on a printed circuit board plug-in card for a PBX or central office.

It should be noted that while the description of this invention is directed to its use as a trunk circuit, the invention is not restricted thereto and can be used for other 1/2/4 wire bidirectional amplifier applications. Accordingly the disclosure and claims should be read with this in mind, to which it is intended that this invention is directed.

In general, the inventive trunk circuit is comprised of tip and ring terminals for connection to tip and ring leads, for carrying signals and a direct current, an AC terminating impedance connected between the tip and ring terminals, and a high impedance signal source connected between the tip and ring terminals, having a direct current conduction path. Means is included for controlling the signal source, including a first light sensitive solid state device for carring a signal which is a function of a signal to be transmitted on the tip and ring leads, and for controlling the passage of current through the first signal source as a function of the current passing through the light sensitive solid sate device so as to apply a desired signal to the tip and ring terminals. Means is included for connecting a second lead pair, including a terminal for carrying trunk signals. An operational amplifier circuit having a signal responsive light emitting means is connected in a load circuit therewith and is optically coupled to the first light sensitive solid state devices. The operational amplifier has its input connected in a signal path to the terminal for carrying trunk signals. A second light sensitive solid state device optically coupled to the light emitting means has a transfer function with the light emitting means which is similar to the transfer function of the first light sensitive solid state device with the light emitting means, the second light sensitive solid state device being adapted to apply a differential signal between the input terminals of the operational amplifier means. The tip and ring terminals are thus caused to carry signal currents corresponding to a signal current appearing at the terminal for carrying trunks signals.

More generally the invention is a trunk circuit comprising a first lead pair, a second lead pair, and means terminating the first lead pair with a first matching a.c. impedance and a second resistance means. A first transformerless circuit applies an incoming signal from the second lead pair to the first lead pair, and a second transformerless circuit applies an incoming signal from the first lead pair to the second lead pair. A third transformerless circuit cancels signal from said first circuit applied to the first lead pair from being reapplied to the second lead pair. A fourth transformerless circuit cancels signals from the second circuit applied to the second lead pair from being reapplied to the first lead pair.

In the description to follow, a signal on "the terminal" will be referred to; it is intended that this be construed as either signal current carried by a lead which may be connected to that terminal, or a signal voltage which can be measured between that terminal and common or circuit ground.

A better understanding the invention will be obtained by reference to the detailed description below of the preferred embodiment, and to the following figures, in which:

FIG. 1 is a block schematic of the invention in its broadest form,

FIG. 2 is a schematic of the invention in its simpliest form, and

Figure 3:
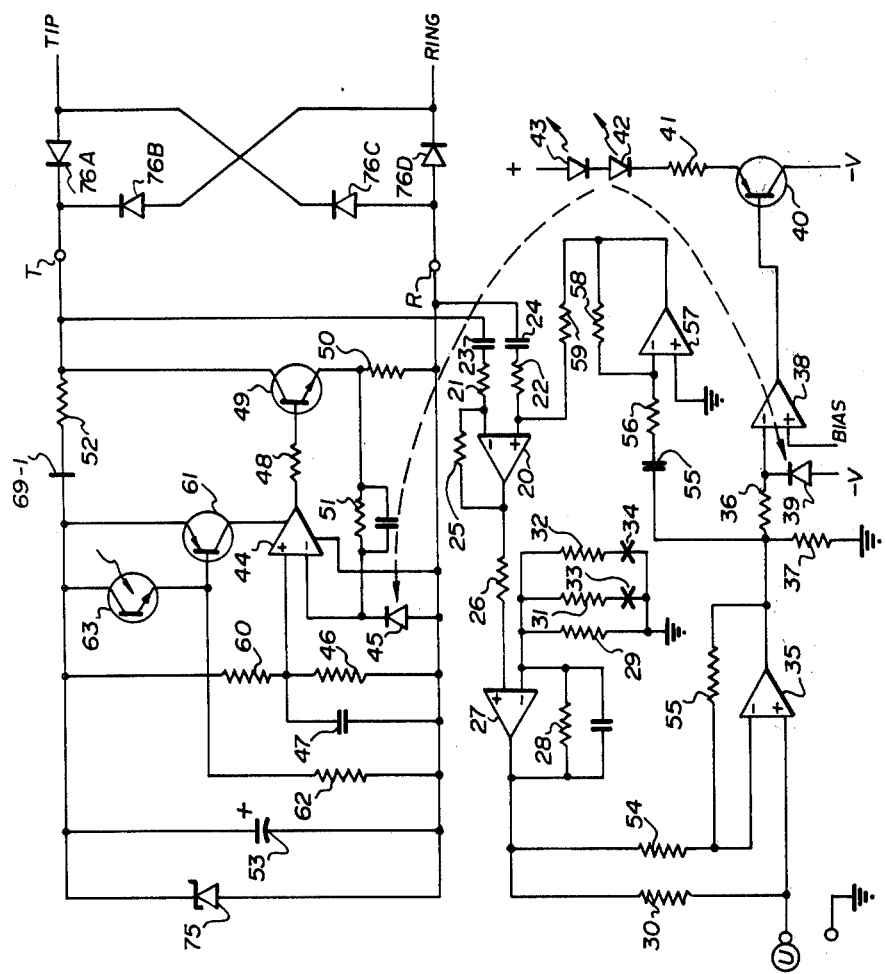
FIG. 3 is a schematic of the preferred form of the invention in its most detailed form.

Turning first to FIG. 1, tip and ring terminals T and R are provided for connection to the first tip and ring leads of a trunk. The trunk is terminated with an impedance means 1, which matches the trunk impedance for AC, and also provides required DC resistance. While the AC impedance is selected to match the trunk impedance (i.e. 900 ohms or 600 ohms), the DC resistance typically is under 250 ohms. The AC impedance can of course be provided by a resistor, for instance of 900 or 600 ohms, in series with a large valued capacitor.

Means is also provided for connecting a second lead pair to terminal U and system ground.

A first transformerless circuit means 2 is connected between the unbalanced terminal U in a circuit path to the tip and ring terminals T and R for applying an incoming signal from the second lead pair to the first lead pair. A second transformerless circuit means 3 is connected in a circuit path between the tip and ring terminals T and R to the terminal U, for applying an incoming signal from the first lead pair to the second lead pair.

Third transformerless circuit means 4a is provided for cancelling signal from the first circuit means 2 which is applied to the first lead pair from being reapplied to the unbalanced lead pair and fourth transformerless circuit means 4b is provided for cancelling signal from the second circuit means 3 which is applied to the second lead pair from being reapplied to the first lead pair.

Accordingly a transformerless translation is provided which individually controls the paths of the signals from the second to the first lead pair, and from the first to the second lead pair, and yet prevents sidetone or positive feedback of the signal from being reapplied back to its source.

In the following description, it will be assumed that the tip and ring leads are balanced and the U terminal to ground is unbalanced, for example purposes only. However the invention is not restricted thereto.

FIG. 2 is a schematic of the invention in its simplest form. Tip and ring terminals T and R are provided for connection to the balanced tip and ring leads, and normally carry both trunk signals and a direct current. Terminating the tip and ring terminals is a matching resistor 5 in series with a large valued capacitor 6, which series circuit is connected between the tip and ring terminals.

Terminating the tip and ring terminals for direct current is the collector - emitter circuit of transistor 7, which has its collector connected to the tip or ring terminal and its emmitter in series with a small valued resistor 8 to the other of the tip or ring terminal.

Also connected to either the tip or ring lead is one terminal of a light sensitive solid state device, such as light sensitive diode 9. The diode is also connected for AC between the inverting and noninverting inputs of operational amplifier 10. The output of operational amplifier 10 is connected to the base of transistor 7.

Also connected from the junction of light sensitive diode 9 and the input of operational amplifier 10, to the junction of resistor 8 and the emitter of transistor 7 is a resistor 11.

The terminal U is also connected to the input of the operational amplifier 12 through a resistor 16. A second light sensitive solid state device such as light sensitive diode 13 is connected between the inverting and noninverting input of operational amplifier 12. The output of operational amplifier 12 is terminated by a load which includes the series of two light emitting diodes 14 and 15.

Light emitting diode 14 is optically coupled to light sensitive diode 9 and light emitting diode 15 is optically coupled to light sensitive diode 13.

Of course the circuitry shown will require other circuit components for biasing, appropriate loading, etc, but these will be obvious to a person skilled in the art. For instance, the output of operational amplifier 10 preferably has a low valued resistance in series therewith; the noninverting input of the same amplifier will require biasing, etc.

The circuitry involving the light sensitive solid state device and light emitting devices can alternatively be of other form, as long as the result is linear translation of the input signal. Various kinds of line translation circuitry which can be used are described in Electronics magazine, Jan. 19, 1978 pages 121-125, in the article Differential Optical Coupler Hits New High In Linearity, Stability, by Bill Olschewski. For example, light emitting diodes 14 and 15 can be a single signal responsive light emitting device.

Amplifier 10, while described as an operational amplifier, can be a transistor for example of similar polarity as transistor 7. Its collector can be connected to the collector of transistor 7, its emitter to the base of transistor 7, and diode 9 can be connected between its base and collector. Resistor 11 would then be connected to the junction of resistor 9 and the ring lead.

In operation of the circuit shown in FIG. 2, it will be seen that signals on the U lead are applied to the input and are amplified by operational amplifier 12. These signals cause current to be drawn through light emitting diodes 14 and 15. Diodes 14 and 15 are chosen to have similar transfer characteristics with diodes 9 and 13. Since light emitting diode 15 is optically coupled to light sensitive diode 13, a feedback loop is provided whereby the gain of the amplifier and the current drawn through light sensitive diode 13 are controlled.

Since the transfer characteristics of diodes 14 and 9, and 15 and 13 are similar, and since diode 9 is connected for AC directly between the input terminals of operational amplifier 10, the signal current which appears thereacross is virtually an exact duplicate of the signal current through diode 13. Since the signal through diode 13 is controlled due to it appearing within the aforenoted feedback loop, as a result the signal applied to operational amplifier 10 is that which would exist were it connected in the same feedback loop, as if operational amplifier 12 were translating the same signal. Accordingly the input signal from terminal U is applied to operational amplifier 10 in a controlled, yet isolated manner.

The output signal of operational amplifier 10 is applied to the base of transistor 7, and the DC current conducted in its collector - emitter circuit is thereby modulated, and is thus applied to the tip and ring terminals T and R.

Therefore, the collector current is dependent on the signal current passing through light sensitive diode 9 rather than signal voltage applied to the base.

Due to the nature of the input characteristics of an operational amplifier, diode 9 connected directly across input terminals of operational amplifier 10 results in virtually zero volts of signal appearing across light sensitive diode 9. Accordingly considering the circuit between node A and the ring terminal R, the signal voltage between them is equal to the current in diode 9 multipled by the value of the resistance of resistor 11. The current passing through resistor 8 is equal to the voltage at node A divided by the resistance of resistor 8, which current, it will be noted, is equal to the current through diode 9 multiplied by the ratio of resistor 11 to resistor 8.

The emitter current of transistor 7 is equal to the aforenoted ratio plus the current through diode 9 which passes through resistor 11. Accordingly the collector current is equal to the common base current gain of the transistor multiplied by the aforenoted emitter current. If the current gain of the transistor is virtually equal to unity, and if the resistance of resistor 11 is much greater than the resistance of resistor 8 (as is preferred), then the collector current of the transistor is equal to the aforenoted ratio of the resistors 11 and 8 multiplied by the current carried by diode 9. Since the AC signal applied to the tip and ring terminals T and R is derived from the collector current of transistor 7, it is clear that it is directly related to the signal current in diode 9 multiplied by a linear relationship, that is, the relationship of the aforenoted ratio of the resistances of resistors 11 and 8.

It is further clear that the AC signal current in diode 13 is closely controlled by its location in the earlier-described feedback loop, and is similar current as appears with diode 9, which itself is multiplied by an easily controllable value, the aforenoted ratio of resistances of resistors 11 and 8.

Turning now to FIG. 3, a detailed schematic of the invention is shown. Ignoring for a moment the bridge rectifier which will be referred to later, a signal from the tip and ring leads is applied to tip and ring terminals T and R. This signal is applied to operational amplifier 20 through input resistors 21 and 22 and DC blocking capacitors 23 and 24. It is preferred that the value of each of resistors 21 and 22 should be at least 100 times the AC impedance of the tip and ring balanced lead pair. It is also preferred that the gain of this stage be approximately 0.1 to 0.11. A feedback resistor 25 connects the output of operational amplifier 20 to its inverting input terminal in the conventional manner. Amplifier 20 is thus connected as a standard operational amplifier, to remove common mode signals which may appear on the tip and ring leads. The gain of amplifier 30 is low to prevent saturation thereof in the presence of large common mode signals.

The output of operational amplifier 20 is connected through resistor 26 to the noninverting input of an operational amplifier 27. This amplifier has a conventional feedback resistor 28 between its output and inverting input (bypassed by a small capacitor), and a resistor 29 to common or ground. It is preferred that with the present circuit the gain of this stage should be approximately 8.

The output of operational amplifier 27 is connected through resistor 30 to the unbalanced terminal U. Resistor 30 should be of value to match the unbalanced external impedance of the unbalanced pair at terminal U. For example, where this trunk circuit is used in a PBX, the impedance at terminal U would be typically 600 ohms while the tip and ring balanced impedance would be typically 900 ohms.

A gain of 0.1 in operational amplifier 20, followed by a gain of 9 in operational amplifier 27 provides a total loss of 1.9d6. This is an example of a circuit for coupling of 900 ohms trunk to a 600 ohms termination at terminal U, with optional matching. A zero dbm power level in 600 ohms is of course at a lower voltage than zero dbm in 900 ohms.

The signal level at terminal U is reduced to half at the output of operational amplifier 27 if terminated by a resistor equal in value to resistor 30 (i.e 600 ohms).

Other impedance conversions can be made by adjusting the gains of the amplifier and circuit impedance.

The tip and ring signal level as applied to the circuit of operational amplifier 20 is reduced by a factor of 10, then raised by a factor of 8 at the output of operational amplifier 27. A 5 volt input signal is therefore transformed to approximately 4 volts unbalanced. The signal level at terminal U would then be 2 volts assuming it has a matching termination. These signal level proportions have been chosen as they are the internal central office or PBX and external trunk signal levels standardized by telephone companies.

It is a feature of the present invention that the level of the signal as applied to terminal U can be selectively increased, to accommodate reduced levels which would occur during internal conferencing within the central office on PBX which includes a call on the instant trunk. Resistors 31 and 32 individually bypass resistor 29 through externally actuated individual switch contacts 33 and 34. The gain of the stage including operational amplifier 27 can thus be increased by switching resistors 31 or 32 in parallel with resistor 29. The three gains thus provided by this amplifier are preferred to be about 8, 11, and 15.

For signals passing in the return direction, operational amplifier 35 has its noninverting input connected to terminal U. The output of this amplifier is connected through input resistor 36 to the inverting input of operational amplifier 38. As was described with reference to FIG. 2 this operational amplifier has a light sensitive diode 39 (corresponding to diode 13) connected for AC across its input terminals. One terminal of light sensitive diode 39 is connected for DC to a source of negative potential, and the noninverting input of operational amplifier 38 is connected to a source of bias preferably the same as the source of negative potential; if not, the source of bias and source of negative potential should be connected together for AC. Resistor 37 is connected between resistor 36 and ground.

The output of operational amplifier 38 is connected to the base of transistor 40 to increase its drive capability. The collector - emitter circuit of transistor 40 is connected to a source of potential −V and +V, and its emitter is connected through a current limiting resistor 41 to a pair of series connected light emitting diodes 42 and 43 which are connected to a source of potential +V (assuming an NPN transistor). The transfer and light emitting characteristics of light emitting diodes 42 and 43 should be very closely matched. Light emitting diode 42 and light sensitive diode 39 are optically coupled.

An operational amplifier 44 is also provided which has light sensitive diode 45 (corresponding to diode 9 in FIG. 2) connected for AC across its input terminals. This is realized by connecting the cathode of diode 45 to the inverting input of operational amplifier 44 and its anode to the tip or ring lead (shown as the ring lead for explanation purposes herein). Diode 45 is optically coupled to light emitting diode 43. The noninverting input of operational amplifier 44 is connected through resistor 46 to the ring lead; resistor 46 is bypassed by capacitor 47.

The output of operational amplifier 44 is connected through resistor 48 to the base of a relatively heavy current carrying transistor 49. Transistor 49 has its collector - emitter circuit connected between the tip and ring leads, through small valued resistor 50. The junction of the emitter of transistor 49 and resistor 50 is connected through resistor 51 to the junction of diode 45 and the inverting input of operational amplifier 44.

A terminating resistor 52 having a value matching the balanced tip and ring lead impedance (i.e typically 900 ohms) is connected in series with a large valued capacitor 53 (for providing an AC short circuit), which series circuit is connected between the tip and ring leads.

In operation of the above described circuit, signals from the unbalanced pair at terminal U, which are at ½ the tip and ring amplitude level, are applied to operational amplifier 35 and as a result to operational amplifier 38. Light sensitive diode 39, typically can be biased to about 12.5 microamperes. The gain in operational amplifier 35 is preferably set such that full signal level at the tip and ring amplitude level is obtained at its output, and is applied to the circuit comprising operational amplifier 38.

The output signal current of operational amplifier 38 is applied to the base of transistor 40, which conducts current in its collector - emitter circuit resulting in current passing through light emitting diodes 42 and 43. As described earlier light emitting diode 42 and light sensitive diode 39 are optically coupled and form a feedback loop around operational amplifier 38.

It was noted earlier that the transfer characteristics of light emitting diode 43 with light sensitive diode 45, and light emitting diode 42 with light sensitive diode 39 should be closely matched. The signal current at the output of operational amplifier 35 passes through resistor 36 to the negative input of operational amplifier 38. Due to the high gain of the operational amplifier, the current through the light emitting diodes is such that light sensitive diode 39 is caused to draw current sufficient to cause the potential at the inverting input of operational amplifier 38 to be at −V (bias), which is at ground potential for AC signals. The current in light sensitive diode 39 is thus the signal voltage at the output of operational amplifier 35 divided by the resistance of resistor 36. The DC current is the bias voltage at the output of operational amplifier 35 minus the voltage −V divided by the resistance of resistor 36.

Due to the matched transfer characteristics, the current passing through light sensitive diode 45 is the same as the current through diode 39.

As was also described with reference to FIG. 2, the collector signal current in transistor 49 is equal to the ratio of the resistances of resistors 51 and 50 multiplied by the signal current in diode 45, plus the noninverting voltage at the input of operational amplifier 44 divided by the resistance of resistor 50. Accordingly the level of the outgoing signal of the tip and ring leads can be controlled by the ratio of resistors 51 to 50. The preferred ratio is 1,000; the current in diode 45 need only be 1,000th of the signal current applied to the tip and ring and there is accordingly a 30 DB power gain.

The DC current is controlled by the bias current in diode 45 and the noninverting voltage at the input of operational amplifier 44, the latter being fixed by the ratio of the resistances of resistors 60 and 46, and is proportional to the DC voltage across the tip and ring leads.

As an example, it will be noted that the signal current in diode 39 is equal to the voltage at the output of operational amplifier 35 divided by the resistance of resistor 36. This is the same signal current as in light sensitive diode 45. The signal current applied to the tip and ring leads is the collector current of transistor 49, which is equal to the voltage at its emitter divided by the resistance of resistor 50. This is equal to the current in light sensitive diode 44 times the ratio of the resistances of resistors 51 and 50. Accordingly the current applied to the tip and ring leads is equal to the voltage at the output of operational amplifier 35 divided by the resistance of resistor 36 times the ratio of the resistance of resistors 51 and 50.

The signal voltage applied to the tip and ring leads is the product of the impedance across the tip and ring leads and the current applied thereto. The impedance across the tip and ring leads is the termination impedance in parallel with the impedance applied to the tip and ring lead. Assuming, for example, that the tip and ring line impedance is 900 ohms and the termination impedance (resistor 52) is 900 ohms, and assuming the resistance of resistor 51 is 20,000 ohms, resistor 50 is 20 ohms and resistor 36 is 374,000 ohms, the voltage applied to the line is $$(450 \times 20,000)/(374,000 \times 20) = 1.203.$$

This value, it will be recognized, is the voltage ratio required to transfer a signal of the same power from a 600 ohm line to a 900 ohm line.

The circuit also provides means for safeguarding against sidetone, or positive feedback of the signal arriving from either the tip and ring balanced pair or the U terminal and being fedback to the source.

It will be recalled that signal is applied from operational amplifier 27 through a 600 ohm resistor 30 to the U terminal. This signal also appears on the noninverting input of operational amplifier 35. The same signal, but with a different amplitude is applied through resistor 54 to the noninverting input of the same and resistor 55 is connected between the output of operational amplifier 35 and the noninverting input. Resistor 54 is chosen of such value sufficient that gain of amplifier 35 multiplies the signal from the output of operational amplifier 27 applied to the noninverting input of operational to a different extent than the same signal applied to its inverting inputs such that the signal is cancelled.

It should be noted that signals at the output of operational amplifier 27 should be at full balanced line level and are reduced by half in resistor 30 for application to the U terminal. Signals originating from the U terminal are applied to the noninverting input of operational amplifier 35. Accordingly a differential signal is produced at the input of operational amplifier 35 from signals originating at the U terminal, but signals originating at the balanced tip and ring terminals and which appear the output of operational amplifier 27 are cancelled within the circuit of operational amplifier 35. The latter signals are accordingly not applied to operational amplifier 38 and do not appear as part of the signal coupled from the light emitting diodes to the circuit which provides an output to the tip and ring leads.

It was noted that signals originating on the U terminal appear at the output of operational amplifier 35. Connected thereto is an AC coupling circuit including capacitor 55 and series resistor 56 which are coupled to the inverting input of operational amplifier 57. A conventional feedback resistor 58 connects the output of operational amplifier 57 to the inverting input. Its noninverting input is connected to common or ground. The output of operational amplifier 57 is connected through resistor 59 to the noninverting input of differential amplifier 20.

Signals arriving from the U terminal at the output of operational amplifier 35 are coupled via capacitor 55 and resistor 56 to the input of operational amplifier 57. From there they are coupled to the noninverting input of operational amplifier 20. Preferably the gain of the stage which includes operational amplifier 57 is ⅔, for the present case of 900 ohm to 600 ohm conversion. The gain of the stage including operational amplifier 20 to signals from operational amplifier 57 should be approximately 1/10 (with the value of resistor 59 about 1/10 the value of resistors 21 and 22), and the gain of operational amplifier 20 should be approximately −1/10 for outgoing signals on the tip and ring lead applied by transistor 49. If the signals are identical, they will cancel within operational amplifier 20.

Signals translated to the tip and ring lead originating from the U terminal are applied to operational amplifier 20 via resistors 21 and 22, and are also applied thereto at the same level via operational amplifier 57. These signals therefore cancel, and do not pass back through amplifier 27 back to the U lead.

Accordingly the circuitry so far described has translated signals from the balanced tip and ring leads to the unbalanced U lead, at half original signal level. It has also translated signals originating on the unbalanced U lead at said half signal level and has applied them to the balanced tip and ring leads at full level. Yet the circuit has safeguarded against signals originating on the tip and ring leads being fed back through the signal path of the U lead to the tip and ring leads, and has safeguarded against signals originating on the U lead and applied to the tip and ring leads from being fed back from the tip and ring leads to the U lead. A transformerless bidirectional amplifier, including a four to two wire network (as it is commonly called) is thus obtained. Bulky hybrid transformers are accordingly eliminated and the entire circuit can be provided on a printed circuit card.

The circuit has also provided an AC terminating impedance which matches the tip and ring impedance, and as well provides a DC impedance (through transistor 49) which is lower than the AC impedance.

The noninverting input of operational amplifier 44 has been noted as being connected to resistor 46 which is connected to the ring lead, to which a direct current is normally applied from the trunk. The noninverting input is also connected to the tip lead terminal of capacitor 53 via resistor 60. Resistor 60 can typically be 10 times the value of resistor 46. The ratio of the two, connected across the tip and ring leads provides a bias level to operational amplifier 44 preferably to cause it to have its operation point near the minimum expected trunk power supply potential level, for example 2 volts. Its DC current draw is determined by the resulting voltage across resistor 50. If desired, the noninverting input could be connected directly to the ring lead, which causes the operational amplifier 44 to act as a current source.

A power supply circuit for operational amplifier 44 is also provided, comprising transistor 61 which has its collector-emitter circuit connected between a power input terminal of operational amplifier 44 and the tip lead terminal of capacitor 53. The other power input of operational amplifier 44 is connected to the ring lead. The base of transistor 61 is connected to the junction of a bias voltage divider comprising resistor 62 connected to ground and in series with a light sensitive solid state device such as a phototransistor 63, the latter being connected between the base and the tip lead end of capacitor 53.

In operation, current is supplied through transistor 61 to the power input terminals of operational amplifier 44. However when phototransistor 63 is illuminated (as will be described below), the base voltage of transistor 61 is brought near its emitter voltage, effectively cutting off conduction and thus cutting off operation current from operational amplifier 44.

Transistor 63 can be illuminated by its inclusion in a photoisolator, which operates upon reception of outpulsing signals at the U terminal. Operation power is thus applied and cutoff from operational amplifier 44 in synchronization with the pulse.

In addition a relay can be operated in synchronization with the outpulse on terminal U. The relay break contract 69 is connected in the tip lead between resistor 52 and the junction of transistor 61 and capacitor 53, to ensure that capacitor 53, which acts as a power supply for operational amplifier 44, does not discharge through transistor 49.

In the event that the outpulsing ability of the current is not desired, transistors 61 and 63 can be deleted as well as break contact 69 and resistor 62. The power input terminals of operational amplifier 44 can be connected directly across capacitor 53.

Preferably the trunk circuit also includes zener diode 75 which is connected across capacitor 53, to which the operational amplifier 44 power circuit is connected. Zener diode 75 acts as a voltage protector for the power circuit.

The tip and ring terminals also preferably are connected to the tip and ring leads through a bridge rectifier comprising diodes 76a, 76b, 76c and 76d, connected in conventional form. As is well known, the bridge rectifier will cause the correct polarity for operation of this circuit to the T and R terminals, no matter what polarity is the DC voltage across the tip and ring leads. The circuit is therefore insensitive to polarity reversing signalling on the balanced trunk comprising the tip and ring leads.

The circuit described above is insensitive to common mode AC signals on the balanced pair, since they are cancelled in differential amplifier 20. It provides a balanced to unbalanced input, and an unbalanced to balanced input bidirectional amplifier, with safeguarding against sidetone or positive feedback of signals incoming from either trunk or the switching office. Complete control of the translated signal levels and of the AC and DC impedances is provided, as well as means for increasing the level of the incoming signal level in the event this is required due to conferencing on the unbalanced U terminal. The signal applied to the tip and ring is also controllable by means of the variation of the ratio of a pair of resistors.

It will become clear that this circuit is highly useful as a universal trunk for a PBX or other telephone switching office. However its bidirectional attributes, impedance control and signal level control makes it equally applicable for use in other environments.

It may also become clear to a person skilled in the art understanding this invention that numerous other embodiments or variations may be made. All are considered within the sphere or scope of this invention, as defined in the appended claims.

The embodiments of the invention in which exclusive property or priviledge is requested are defined as follows:

1. A signal translation circuit comprising:
   (a) tip and ring terminals for connection to tip and ring leads, for carrying signals including a direct current,
   (b) an a.c. terminating impedance connected between the tip and ring terminals,
   (c) a high impedance signal source connected between the tip and ring terminals, having a circuit path for conduction of direct current,
   (d) means for controlling the signal source including a first light sensitive solid state device for carrying a signal which is a function of a signal to be transmitted on the tip and ring leads, and for controlling the passage of current through the signal source as a function of the current passing through the light sensitive solid state device so as to apply a desired signal to the tip and ring terminals,
   (e) means for connecting a lead pair, including a terminal for carrying trunk signals,
   (f) an operational amplifier means having a light emitting means connected in a load circuit therewith and optically coupled to the first light sensitive solid state device, the operational amplifier having its input connected in a signal path to the terminal for carrying trunk signals,
   (g) a second light sensitive solid state device optically coupled to the light emitting means having a transfer function with the light emitting means which is similar to the transfer function of the first light sensitive solid state device with the light emitting means, the second light sensitive solid state device being adapted to apply a differential signal between the input terminals of the operational amplifier means,
   whereby the tip and ring terminals are caused to carry signal currents corresponding to a signal current appearing at said terminal for carrying trunk signals.

2. A trunk circuit as defined in claim 1 which the high impedance signal source is comprised of the collector-emitter circuit of a transistor having a low resistance resistor connected in series therewith, the base electrode of the transistor being connected to the output of a second operational amplifier means, the first light-sensitive solid state device comprising a light sensitive diode having one lead connected between one of the inputs of the second operational amplifier means and the tip or ring lead, and also including a further resistor connected between said one of the inputs of the second operational amplifier means and the junction between the low resistance series resistor and the transistor, and further circuit means providing a low AC impedance path from said other input of the second operational amplifier means to another lead of the light sensitive diode.

3. A trunk circuit as defined in claim 1 or 2 further including a first differential amplifier means having a pair of inputs, each connected respectively through a high impedance to the tip and ring terminals, and an output connected via a circuit path through a matching impedance to said terminal for carrying trunk signals; a second differential amplifier having one input connected to said terminal for carrying trunk signals and another input connected through a first balancing impedance to the circuit path connected to the output of the first differential amplifier; the second differential amplifier being connected in series with the circuit path to the input of said operational amplifier means and with its output further connected through a second balancing impedance to one of the inputs of the first differential amplifier, the first balancing impedance being of such value as to apply signals to the second differential amplifier at a level such as to cancel signals therein arising from the tip and ring leads, and the second balancing impedance being of such value as to apply signals from the second differential amplifier at a level such as to cancel signals therein arriving from the unbalanced terminal of the unbalanced lead pair.

4. A trunk circuit as defined in claim 1 or 2, in which the light emitting means is comprised of a pair of series connected light emitting diodes, one optically coupled to the first light sensitive solid state device and one optically coupled to the second light sensitive solid state device.

5. A trunk circuit comprising:
   (a) a pair of terminals for connection to a tip and ring lead,
   (b) a first resistor for matching the impedance of a telephone line which may be connected to said terminals, connected in series with a capacitor having large capacitance for providing a very low impedance to voice frequency signals, the series circuit being connected between said terminals,
   (c) an operational amplifier having a pair of inputs, one input being connected for AC through a first light sensitive means with the other input to one of said terminals,
   (d) a transistor having its emitter connected through a low valued resistor to said one terminal, its collector connected to the other terminal, and its base in a circuit path to the output of the operational amplifier,
   (e) a high valued resistor connected between said one input of the operational amplifier and the junction between the low valued resistor and the emitter,
   (f) a further operational amplifier having a second light sensitive means connected between its input terminals,
   (g) means for applying an unbalanced signal between the input terminals of the further operational amplifier,
   (h) a signal responsive light emitting diode connected in a load circuit driven by the further operational amplifier,
   (i) means optically coupling the light emitting diode to the first light sensitive means, and to the second light sensitive means to form a feedback loop, whereby the transfer characteristic of said one light emitting means with the first light sensitive means is similar to the transfer characteristics of the other light emitting diode with the second light sensitive means, the collector signal current in the transistor being approximately equal to the ratio of the high to low valued resistors multiplied by the signal current in the first light sensitive means.

6. A trunk circuit as defined in claim 5 further including means for connecting the first operational amplifier across the terminals of the capacitor and for supplying operating and bias voltage for the first operational amplifier thereby.

7. A trunk circuit as defined in claim 5, in which the means for applying an unbalanced signal is comprised of a third terminal for carrying a signal relative to common or ground, a third operational amplifier having an input connected to the third terminal and an output connected in a signal path to an input of the second operational amplifier, and further comprising means for applying a trunk signal from said pair of terminals to said third terminal, and means for cancelling signals passing through the second operational amplifier applied to said pair of terminals to prevent them from being translated by said means for applying a trunk signal and being reapplied to said third terminal.

8. A trunk circuit as defined in claim 7 further comprising means for cancelling signals which had passed through said means for applying a trunk signal to prevent them from being translated by the second operational amplifier and thus being reapplied to said pair of terminals.

9. A trunk circuit as defined in claim 8 in which said means for applying a trunk signal and both said means for cancelling signals is comprised of a first differential amplifier having each of its inputs connected through a pair of resistors to individual ones of said pair of terminals, the value of each of the resistors being at least 100 times the impedance of the telephone line, a signal path from the output of the first differential amplifier to said third terminal, a signal path for applying a first predetermined portion of the output signal of the first differential amplifier to a second inverting input of the third operational amplifier, a fourth operational amplifier connected in a signal path to the output of the third operational amplifier with its output connected to one of the inputs of the first differential amplifier for applying a second predetermined portion of the output signal of the fourth operational amplifier to the first differential amplifier, wherein said first predetermined portion is sufficient to cancel signals input to said pair of terminals to prevent them from being translated in the third operational amplifier and said second predetermined portion is sufficient to cancel signals input to said third terminal from being translated by said first differential amplifier.

10. A trunk circuit as defined in claim 9, further including a fifth operational amplifier connected between the output of the first differential amplifier and the signal path to said third terminal, a resistor of value to match an external impedance between said third terminal and ground connected in series circuit between the output of the fifth differential amplifier and said third terminal, said signal path for applying a first predetermined portion of the output signal comprising a resistor connected to the output of the fifth operational amplifier.

11. A trunk circuit as defined in claim 10, in which the gain of the first differential amplifier is about 1/10, the gain of the fifth operational amplifier is at least about 2, the gain of the third operational amplifier is sufficient to bring the level of a signal originating on said third terminal to the level of the signal originating at the pair of terminals, and the gain of the fourth operational amplifier is about ½.

12. A trunk circuit as defined in claim 10 or 11, further including means for selectively increasing the gain of the fifth operational amplifier, whereby the level of the signal applied to said third terminal can be increased.

13. A trunk circuit as defined on claim 5, 7 or 11 further including a bridge rectifier connected to the pair of terminals for interposing between the pair of terminals and a tip and ring lead.

14. A trunk circuit as defined in claim 5, 7 or 11 further including a break contact of a relay means connected between said first resistor and the capacitor, circuit means connected to said third terminal for operating the relay means, a power feeding circuit including a light sensitive solid state device adapted to cause opening of the power feeding circuit connecting the first differential amplifier across the capacitor, and means for illuminating a light emitting diode optically coupled to the light sensitive solid state device for causing illumination of the latter light emitting diode and thus causing the opening of the power feeding circuit.

15. A trunk circuit comprising:
(a) a first lead pair,
(b) a second lead pair,
(c) means terminating the first lead pair with a first matching a.c. impedance and a second resistance means,
(d) first transformerless circuit means for applying an incoming signal from the second lead pair to the first lead pair,
(e) second transformerless circuit means for applying an incoming signal from the first lead pair to the second lead pair,
(f) third transformerless circuit means for cancelling signals from said first circuit means applied to the first lead pair to prevent them from being reapplied to the second lead pair and
(g) fourth transformerless circuit means for cancelling signals from said second circuit means applied to the second lead pair to prevent them from being reapplied to the first lead pair.

16. A trunk circuit as defined in claim 15, in which the first transformerless circuit means is comprised of linear optocoupler means.

17. A trunk circuit as defined in claim 16, further including a current source adapted to conduct current in response to a signal translated by the optocoupler means connected between the lead of the first lead pair.

18. A trunk circuit as defined in claim 17 in which the current source is comprised of the collector-emitter circuit of a transistor, the input of the transistor being connected to the output of an operational amplifier the input to which the output of the optocoupler is connected.

* * * * *